(12) United States Patent
Harada et al.

(10) Patent No.: US 8,562,739 B2
(45) Date of Patent: Oct. 22, 2013

(54) SILICA GLASS CRUCIBLE FOR PULLING UP SILICON SINGLE CRYSTAL AND METHOD FOR MANUFACTURING THEREOF

(75) Inventors: Kazuhiro Harada, Akita (JP); Satoshi Kudo, Tokyo (JP)

(73) Assignee: Japan Super Quartz Corporation, Akita (JP)

( * ) Notice: Subject to any disclaimer, the term of this patent is extended or adjusted under 35 U.S.C. 154(b) by 967 days.

(21) Appl. No.: 12/647,634

(22) Filed: Dec. 28, 2009

(65) Prior Publication Data

US 2010/0162947 A1    Jul. 1, 2010

(30) Foreign Application Priority Data

Dec. 29, 2008    (JP) .................. 2008-335810

(51) Int. Cl.
*C30B 15/04*    (2006.01)
(52) U.S. Cl.
USPC ............. 117/200; 117/13; 117/16; 117/201
(58) Field of Classification Search
USPC ..................... 117/200, 201, 13, 16
See application file for complete search history.

(56) References Cited

U.S. PATENT DOCUMENTS

| 6,510,707 B2 | 1/2003 | Kemmochi et al. | |
| 2002/0166340 A1* | 11/2002 | Kemmochi et al. | 65/17.3 |
| 2003/0012899 A1 | 1/2003 | Kemmochi et al. | |
| 2005/0120945 A1 | 6/2005 | Hansen | |
| 2010/0006022 A1 | 1/2010 | Kishi et al. | |

FOREIGN PATENT DOCUMENTS

| EP | 463543 | * | 1/1992 |
| JP | 53-113780 | | 10/1978 |
| JP | 63-166791 | | 7/1988 |
| JP | 1-261293 | | 10/1989 |
| JP | 2-055285 | | 2/1990 |

(Continued)

OTHER PUBLICATIONS

Korea Office action that issued with respect to patent family member Korean Patent Application No. 10-2009-0131546, mail date is Oct. 17, 2011.

(Continued)

*Primary Examiner* — Bob M Kunemund
(74) *Attorney, Agent, or Firm* — Greenblum & Bernstein, P.L.C.

(57) ABSTRACT

A silica glass crucible used for pulling up a silicon single crystal and made from natural silica a raw material is provided with a region within a certain range from the center of a bottom section of the crucible and up to 0.5 mm deep from an inner surface and which substantially does not include gas bubbles, wherein an average value of a concentration of Al included in a region within the certain range from the center of the bottom section of the crucible and up to 0.5 mm deep from the inner surface is 30 ppm or more and 150 ppm or less. In the case where the inner layer of the crucible bottom section is formed in this way, dents in the inner surface are prevented and the generation of gas bubbles is reduced.

7 Claims, 3 Drawing Sheets

(56) References Cited

FOREIGN PATENT DOCUMENTS

| | | |
|---|---|---|
| JP | 5-009097 | 1/1993 |
| JP | 7-330483 | 12/1995 |
| JP | 8-73293 | 3/1996 |
| JP | 2000-169287 | 6/2000 |
| JP | 2002-326827 | 11/2002 |
| JP | 2003-95678 | 4/2003 |
| JP | 2004-307222 | 11/2004 |
| JP | 2005-343774 | 12/2005 |
| JP | 2007-210803 | 8/2007 |
| JP | 2008-308383 | 12/2008 |
| KR | 10-2006-0115891 | 11/2006 |

OTHER PUBLICATIONS

Japan Office action that issued with respect to patent family member Japanese Patent Application No. 2008-335810, mail date is Jan. 31, 2012.

* cited by examiner

SILICA GLASS CRUCIBLE FOR PULLING UP SILICON SINGLE CRYSTAL AND METHOD FOR MANUFACTURING THEREOF

TECHNICAL FIELD

The present invention is related to a silica glass crucible used for pulling up a silicon single crystal and a method for manufacturing the silica glass crucible. In particular, the present invention is related to a layer structure of the silica glass crucible.

BACKGROUND OF THE INVENTION

A silica glass crucible is used in the manufacture of a silicon single crystal. In a Czochralski (CZ) method, polysilicon is charged into a silica glass crucible, heated and melted and a seed crystal is immersed in this silicon melt, and while mutually rotating the crucible and the seed crystal, the seed crystal is slowly pulled up and a silicon single crystal is grown. In order to manufacture a high purity silicon single crystal for use in semiconductor devices, it is necessary that the silicon single crystal not be polluted by an elution of impurities which are included within the silica glass crucible and in addition, the silica glass crucible requires sufficient heat resistance strength.

There is natural silica and synthetic silica in the raw material of the silica glass crucible and generally natural silica has a lower level of purity than synthetic silica but has excellent heat resistance strength whereas synthetic silica has poor heat resistance strength but a high level of purity. Thus, a silica glass crucible having a two layered structure including forming an outer layer of the crucible with natural silica and increasing the strength of the crucible under a high temperature and forming an inner layer of the crucible which contacts with the silicon melt with synthetic silica and which prevents incorporating impurities, is generally used (refer to Japanese Patent Application Laid Open No. H01-261293). In addition, a crucible which has an inner layer with essentially no gas bubbles is also known (refer to Japanese Patent Application Laid Open No. H02-55285) and a method of increasing the purity of an inner periphery by moving impurity metals included in a fused silica glass in the crucible inner periphery to the outer periphery by what is know as electrolytic refining within the crucible melt is also known (refer to Japanese Patent Application Laid Open No. 2004-307222).

A natural silica glass crucible with only natural silica as a raw material is also well known. According to Japanese Patent Application Laid Open No. S63-166791, a concentration of Al in an inner surface vicinity is set to 150-1000 ppm by a surface condensation of Al in a natural silica glass crucible, and the inner surface of the crucible is etched by 30 μm or more using hydrofluoric acid. In addition, in Japanese Patent Application Laid Open No. H07-330483, a method for reducing surface condensation of impurities is proposed in which elements other than Al also have a high concentration in the vicinity of an inner surface, and by supplying a silica powder bit by bit to the interior of the crucible, scattering the powder across the inner surface, fusing and controlling the deposition speed when depositing the powder for a transparent silica glass layer.

The weight of the silicon which is charged into a crucible is increasing due to the large scale of silicon ingots in recent years. As a result, it becomes more difficult to remove gas bubbles which are included within the silicon melt and these gas bubbles are incorporated into the silicon single crystal during growth causing void defects (also called voids or air pockets) which are formed within the crystal. Such problems have become noticeable. Argon (Ar) gas which is attached to the inner surface of the silica glass crucible, and silicon monoxide (SiO) gas which is produced by a reaction between the silica glass crucible and silicon melt are known as causes of the void defects. The void defects caused by gas bubbles largely have a spherical shape with a diameter of 300-500 μm taking up the majority of its size. However, very small void defects with a diameter of 150 μm or less and very large void defects with a diameter of 1 mm or more are also sometimes formed. In this way, void defects caused by gas bubbles clearly have different characteristics to Grown-in defects such as COP (Crystal Originated Particle). Presently, the presence of these defects can not be nondestructively inspected. The void defects can be detected only after a wafer has been cut from the ingot and appear as through holes or pinholes on the surface or interior section of the wafer.

In recent years, the effects on semiconductor devices by pinholes within a wafer are extremely large. The effects of pinholes differ depending on the size, number, position of generation and type of in the latest semiconductor devices which have a very high integration, because the size of pinholes is extremely large compared to COP, devices can not be formed in the space in which pinholes exist. In particular, because yield of the semiconductor device decreases significantly when the number of pinholes within a wafer is large, the wafer itself has to be discarded. Therefore, it is necessary to reduce the possibility of pinholes being included within a wafer to almost zero.

In order to solves this problem, a method of adjusting a furnace pressure when melting polysilicon is proposed, for example, in Japanese Patent Application Laid Open Nos. H05-9097 and 2000-169287. In addition, a method of providing vibration to a crucible and starting growth of a silicon single crystal after reducing gas bubbles which are attached to the inner surface of the crucible is proposed in Japanese Patent Application Laid Open No. 2007-210803.

However, an environment for preventing generation of gas bubbles described above and a process for removing gas bubbles are not sufficient for manufacturing a high quality silicon single crystal without void defects caused by gas bubbles. A new process for actively removing gas bubbles from a silicon melt is required.

SUMMARY OF THE INVENTION

The present invention solves the problems described above and the object of the present invention is to provide a silica glass crucible for pulling up a silicon single crystal which can prevent the production of void defects caused by gas bubbles included within the silicon single crystal. In addition, the object of the present invention is to provide a manufacturing method of a silica glass crucible which can manufacture a high quality silicon single crystal without void defects caused by gas bubbles.

As a result of repeated keen research into the mechanism in which gas bubbles are generated within a crucible which should solve the above described problem, the inventors of the present invention discovered that the viscosity of a synthetic silica layer at the crucible bottom participates significantly in the generation of gas bubbles and that it is possible to control the generation of gas bubbles when the viscosity of the crucible bottom section is comparatively high.

Presently, synthetic silica is used on an inner surface of many of the silica glass crucibles which are used for pulling up a large diameter silicon single crystal. This is because synthetic silica has a lower level of impurities than natural silica and therefore the single crystal yield is considered to be high when growing the silicon single crystal over a long period of time. However, because synthetic silica has a low viscosity, places where the polysilicon chunks come into contact are easy damaged and dents are easily formed by polysilicon chunks eating into the places where the synthetic silica layer is softened. Furthermore, the crucible bottom easily becomes very hot and SiO gas which is the cause of void defects is easily generated.

On the other hand, the single crystal yield of natural silica when growing a silicon single crystal over a long period of time is low. It is thought that this is because uneven crystallization easily occurs due to impurities and the unevenly crystallized parts peel off during the process of pulling up the silicon single crystal and become attached to an interface between the single crystal and the silicon melt. However, in order to solve these problems, because a method is proposed in which a crucible in which a natural silica glass layer has essentially no gas bubbles or a method of reducing impurities within the natural silica layer by electrolytic refining, it is considered possible to obtain a single crystal yield in natural silica with no large difference with a synthetic silica.

The present invention is based on this type of technical findings and the silica glass crucible used for pulling up a silicon single crystal according to the present invention is a silica glass crucible having natural silica as a raw material wherein gas bubbles essentially do not exist within a certain range from a center of the crucible bottom section and in a region up to 0.5 mm deep from an inner surface, and wherein a concentration of Al included within a certain range from the center of the bottom section and in a region up to 40 μm deep from the inner surface is 30 ppm or more and 150 ppm or less.

In addition, a method for manufacturing a silica glass crucible for pulling up a silicon single crystal according to the present invention includes depositing a natural silica powder onto the inner surface of a rotating mold, and forming a silica glass crucible by arc melting the natural silica powder, wherein the inner surface of the silica glass crucible is etched so that a concentration of Al included within a certain range from the center of the bottom section and in a region up to 40 μm deep from the inner surface is 30 ppm or more and 150 ppm or less.

According to the present invention, because a natural silica glass layer is used even in an inner layer of a crucible, it is possible to reduce the polysilicon chunks which eat into the silica glass crucible when melting the polysilicon, and it is also possible to prevent Ar becoming trapped in the parts eaten into and damage or dents which cause the generation of SiO gas. Therefore, it is possible to prevent the generation of gas bubbles and prevent the generation of void defects within the silicon single crystal. Moreover, because the concentration of alkali metals described above is low and the concentration of Al is high in the vicinity of the inner surface, it is possible to further increase the viscosity of the crucible bottom section and prevent with certainty damage and dents.

In the silica glass crucible according to the present invention, it is preferred that the total concentration of the three elements Na, K and Li which are included within a certain range from the center of the bottom section and in a region up to 40 μm deep from the inner surface be 0.3 ppm or less, and it is particularly preferred that the total concentration of the three elements Na, K and Li which are included in the entire region within a certain range from the center of the bottom section be 0.3 ppm or less. If the concentration of impurities within a certain range from the center of the crucible bottom section meets the above described conditions, it is possible to increase the viscosity of the crucible bottom section and make it more difficult for damage or dents to occur. Furthermore, it is possible to further improve the quality of the silicon single crystal by making the concentration of the above described alkali metals low not only in the vicinity of the inner surface but also in a region up to 1 mm deep.

In the present invention, it is preferred that the total concentration of Al which is included within the certain range from the center of the bottom section and in a region up to 100 μm deep or more from the inner surface be 16 ppm or less. If the concentration of Al in a second natural silica glass layer which forms the crucible bottom section meets the above described conditions, it is possible to prevent contamination by eluting a large amount of Al into the silicon melt.

In the present invention, a region within a certain range from the center of the bottom section is preferred to include a region within 50% of the crucible diameter from the center of the bottom section. In the case where a region up to 50% of the crucible radius from the center of the bottom section is a region of high viscosity, it is possible to prevent the generation of gas bubbles approximately directly below the silicon single crystal during the pulling up process.

In a method of manufacturing a silica glass crucible for pulling up a silicon single crystal according to the present invention, a process for forming the silica glass crucible is preferred to further include a process of electrolytic refining during arc melting so that the total concentration of the three elements Na, K and Li which are included within a certain range from the center of the bottom section and in a region up to 40 μm deep from the inner surface becomes 0.3 ppm or less after etching. If the concentration of impurities within a certain range from the center of the crucible bottom section meets the above described conditions, it is possible to increase the viscosity of the crucible bottom section and make it more difficult for damage or dents to occur.

In this way, according to the present invention, it is possible to provide a silica glass crucible which can manufacture a high quality silicon single crystal and prevent the generation of void defects caused by incorporation of SiO gas bubbles with the silicon single crystal.

In addition, according to the present invention, it is possible to provide a manufacturing method of a silica glass crucible which can manufacture a high quality silicon single substrate with no void defects.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENT

Preferred embodiments of the present invention will now be described in detail hereinafter with reference to the accompanying drawings.

Figure 1:
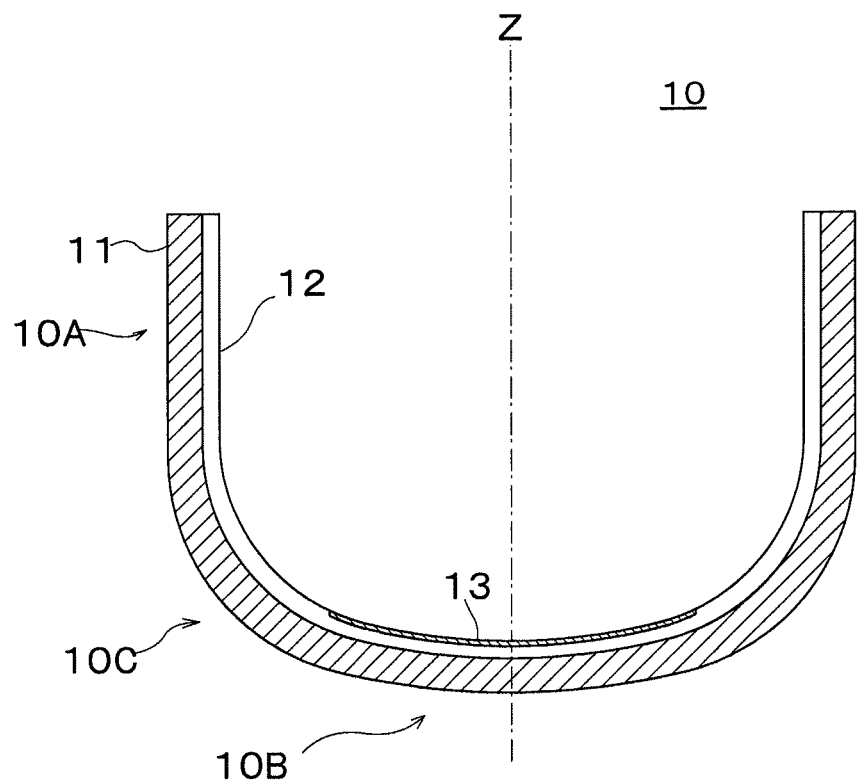
FIG. 1 is a schematic cross sectional view which shows a structure of a silica glass crucible for pulling up a silicon single crystal according to a preferred embodiment of the present invention.

FIG. 1 is a schematic cross sectional view which shows a structure of a silica glass crucible for pulling up a silicon single crystal according to a preferred embodiment of the present invention.

As shown in FIG. 1, the silica glass crucible 10 according to the present embodiment is a natural silica glass crucible having natural silica as a raw material and is comprised of an opaque silica glass layer 11 which forms an outer layer of the crucible, and a transparent layer 12 which forms and inner layer of the crucible. Generally, natural silica has a higher concentration of metallic impurities and lower concentration of an OH group than synthetic silica. For example, the concentration of Al in a natural silica glass layer is 1 ppm or more, the concentration of an alkali metal (Na, K and Li) are each 0.05 ppm or more and the concentration of an OH group is below 50 ppm. Furthermore, whether a natural silica glass or not should not be judged on the basis of one element but should be judged as a whole on the basis of a plurality of elements. Because the natural silica glass has a higher viscosity at high temperatures compared to synthetic silica glass, it is possible to increase the heat resistance strength of the entire crucible. In addition, natural silica is cheaper than synthetic silica making it advantageous in terms of costs.

The natural silica glass layer 11 is an amorphous silica glass layer including multiple micro bubbles and is arranged over the entire silica glass crucible 10 from a sidewall section 10A to the bottom section 10B. Because the opaque silica layer 11 has a higher heat resistance compared to the transparent silica glass layer 12, it is possible to increase the heat resistance of the entire crucible. It is preferred that a bubble containing ratio of the opaque silica glass layer 11 be 0.7-2% and the average diameter of the bubbles are preferred to be around 100 μm. Here, the bubble containing ratio is defined as the ratio ($W_2/W_1$) of a bubble occupied volume ($W_2$) per unit volume ($W_1$).

The transparent silica glass layer 12 is an amorphous silica glass layer which essentially does not include bubbles, and is arranged over the entire crucible from the sidewall section 10A to the bottom section 10B the same as the opaque silica glass layer 11. The transparent silica glass layer 12 plays the role of preventing the generation of gas bubbles within the silicon melt. Here, "essentially does not include bubbles" means that the bubble containing ratio is 0.1% or less and the average diameter of the bubbles is 40 μm or less. When bubbles exist in the vicinity of the inner surface, the bubbles thermally expand when heating, the crucible inner surface partially peels off, and the peeled off silica fragments are incorporated into the silicon single crystal causing a decrease in the single crystal yield. However, if the bubble containing ratio within the transparent silica layer 12 is 0.1% or less, because dislocation of the silicon single crystal decreases it is possible to improve the crystal yield. However, apart from "a region within a certain range from the center of the crucible bottom section and up to 0.5 mm deep from the inner surface" for example, a transparent silica glass layer of the sidewall section 10A sometimes requires intentionally adjusting a bubble containing ratio to 0.1% or less within the aim of preventing surface vibration. Consequently, usually it is not necessary for the bubble containing ratio of the transparent silica glass layer 12 to be 0.1% or less at all sites, and as long as there is no influence on the silicon single crystal yield, the ratio may also be 0.1% or more.

The sidewall section 10A of the crucible is a cylindrical section which is parallel to the center axis (Z axis) of the crucible and extends approximately directly down from the opening of the crucible. However, the sidewall section 10A does not have to be completely parallel with respect to the Z axis and may incline so that it gradually widens towards to the opening. In addition, the sidewall section 10A may be a straight line or may curve smoothly.

The bottom section 10B of the crucible is the roughly disk shaped section which includes the intersection point with the crucible Z axis and the corner section 10C is formed between the bottom section 10B and the sidewall section 10A. The bottom section 10B should at least cover a projection plane of the silicon single crystal which is pulled up. The shape of the bottom section 10B may be a round bottom or a flat bottom. In addition, it is possible to arbitrarily set the curvature and angle of the corner section 10C. When the bottom section 10B is a round bottom, because the bottom section 10B has adequate curvature, the difference in curvature between the bottom section 10B and the corner section 10C is much smaller than a flat bottom. In the case where the crucible bottom section 10B is a flat bottom, the bottom section 10B has an even or extremely moderate curved surface and the curvature of the corner section 10C is very large. Furthermore, the bottom section 10B is defined as a region in which the tangent angle of inclination of a crucible sidewall surface with respect to a flat surface XY which intersects the Z axis is 30° or less.

It is preferred that the thickness of the crucible be 8-30 mm and the thickness of the transparent silica glass layer 12 be 0.5 mm or more. This is because although usually about 0.1-0.5 mm of the crucible inner surface is lost due to melting when pulling up the silicon single crystal, when the transparent silica glass layer 12 is thinner than 0.5 mm, the transparent silica glass layer 12 is completely dissolved when pulling up the crystal and the opaque silica glass layer 11 may be exposed. Furthermore, the thickness of the transparent silica glass layer 12 may be uniform or may be formed so that it gradually becomes thicker heading towards the outer side from the center of the bottom section. In addition, the thickness of the corner may be formed so that it is different from the bottom section and sidewall section.

A high viscosity region 13 with a comparatively high concentration of Al is arranged in the crucible bottom section 10B in order to control the damage and dents in an inner surface of the crucible bottom section B. The Al concentration within the high viscosity region 13 is required to be an average value of 30 ppm or more and 150 ppm or less in a region 40 μm deep from the inner surface of the crucible. Al, which is included in natural silica powder as an impurity, acts to increase the viscosity within the crucible, however, in the case where the average value of the concentration of Al is smaller than 30 ppm, the effects of increasing viscosity of the bottom section are insufficient and damage or dents are easily formed in the inner surface. In addition, in the case where the average value of the concentration of Al exceeds 150 ppm, it is possible to sufficiently increase the viscosity of the bottom section and damage or dents are easily formed in the inner surface, however, the silicon single crystal yield may drop rapidly.

The time when damage and dents are formed in the inner layer of the crucible is up to when the polysilicon chunks within the crucible have melted to a certain extent and it is thought that after this damage and dents are almost never formed. Consequently, if it sufficient if the inner surface of the crucible is hard up to when the polysilicon chunks have melted to a certain extent and after this, the concentration of impurities in the inner surface of the crucible should be low in order to prevent contamination of the silicon single crystal. For these reasons, it is necessary for the concentration of Al in the vicinity of the inner surface to be high, specifically, it is necessary for the concentration of Al to be 30 ppm or more and 150 ppm or less in a position 40 μm deep from the crucible inner surface.

Because the Al concentration of a silica glass layer having natural silica powder as the raw material is at its highest in the vicinity of the crucible inner surface due to surface condensation effects (surface segregation) being 150-1000 pm immediately after formation of the crucible, the inner surface is etched by about 30 μm using hydrofluoric acid and the Al concentration of the final crucible inner surface is ppm or less (See JPA H07-330483). Unlike this conventional silica glass crucible, the average value of a concentration of Al included in a region up to 40 μm deep from the inner surface of the silica glass crucible according to the present invention is 30 ppm or more and 150 ppm or less which is higher than the concentration of Al in the natural silica glass crucible which has undergone conventional etching. In this way, the concentration of Al in the vicinity of the inner surface of the silica glass crucible according to the present invention is neither to high or too low, and because it falls within an appropriate range it is possible to increase the viscosity of the crucible inner surface without reducing the single crystal yield and also create a state in which it is difficult for damage or dents to form in the inner surface.

Furthermore, the concentration of Al in the high viscosity region 13 is preferred to be 16 ppm or less in a region having a depth of 100 μm or more from the crucible inner surface. If the concentration of Al in a comparatively deep region from the crucible inner surface is 16 ppm or less, it is possible to reduce an extreme increase in the concentration of Al with in the silicon melt caused by dissolving of the crucible, and it is possible to prevent an increase in the concentration of Al within the silicon single crystal.

In the high viscosity region 13, the total concentration of the three elements Na, K and Li in the vicinity of the crucible inner surface is preferred to be sufficiently low, and is preferred to be 0.3 ppm or less in a region up to 40 μm deep from the inner surface. These alkali metals included as impurities in the natural silica powder act to reduce the viscosity of the crucible because when the concentration of these alkali metals is high, damage and dents are easily formed in the inner surface. However, if the total concentration of the three elements described above is sufficiently low, it is possible to increase the viscosity of the crucible and reduce the damage and dents in the inner surface. Control of the concentration of these alkali metals is preformed by electrolytic refining described below.

As stated above, the time when damage or dents are formed in the inner surface of the crucible is up to when polysilicon chunks within the crucible have melted to a certain extent, and is necessary for the inner surface of the crucible bottom section 10B to be hard only up to melting of the polysilicon chunks, after this, the concentration of the alkali impurities in the crucible inner surface should be low in order to prevent contamination of the silicon single crystal and the concentration of Al is preferred to be 16 ppm or less. For the above reasons, it is particularly preferred that the total concentration of the three elements Na, K and Li in the high viscosity region 13 be 0.3 ppm not only in a region up to 40 μm deep from the inner surface of the crucible but also in the entire region in a depth direction from the inner surface of the crucible.

The high viscosity region 13 may be formed in the crucible sidewall section 10A or corner section 10C. This is because the possibility that SiO gas bubbles generated from the crucible sidewall section 10A and corner section 10C or Ar gas trapped in convex parts are incorporated into the silicon single crystal is extremely low. The ascent speed of the SiO gas within the silicon melt is 30-60 cm/sec whereas the convection flow speed of the silicon melt is only a few mm/sec and the generated SiO gas bubbles do not flow with the convection flow but rise almost vertically within the silicon melt. Therefore, the sidewall section 10A and the corner section 10C do not become the cause of void defects. Furthermore, rather than preventing the formation of damage or dents in the inner surface of the crucible sidewall section 10A and corner section 10C, the required characteristics of a usual crucible inner surface, that is, preventing a decrease in the single crystal yield due to the elution of impurities or peeling of silica chunks is required. Therefore, unlike the crucible bottom section 10B, it is not necessary that the region up to 40 μm deep from the inner surface of the crucible sidewall section 10A and the corner section 10C be the high viscosity region 13.

Figure 2:
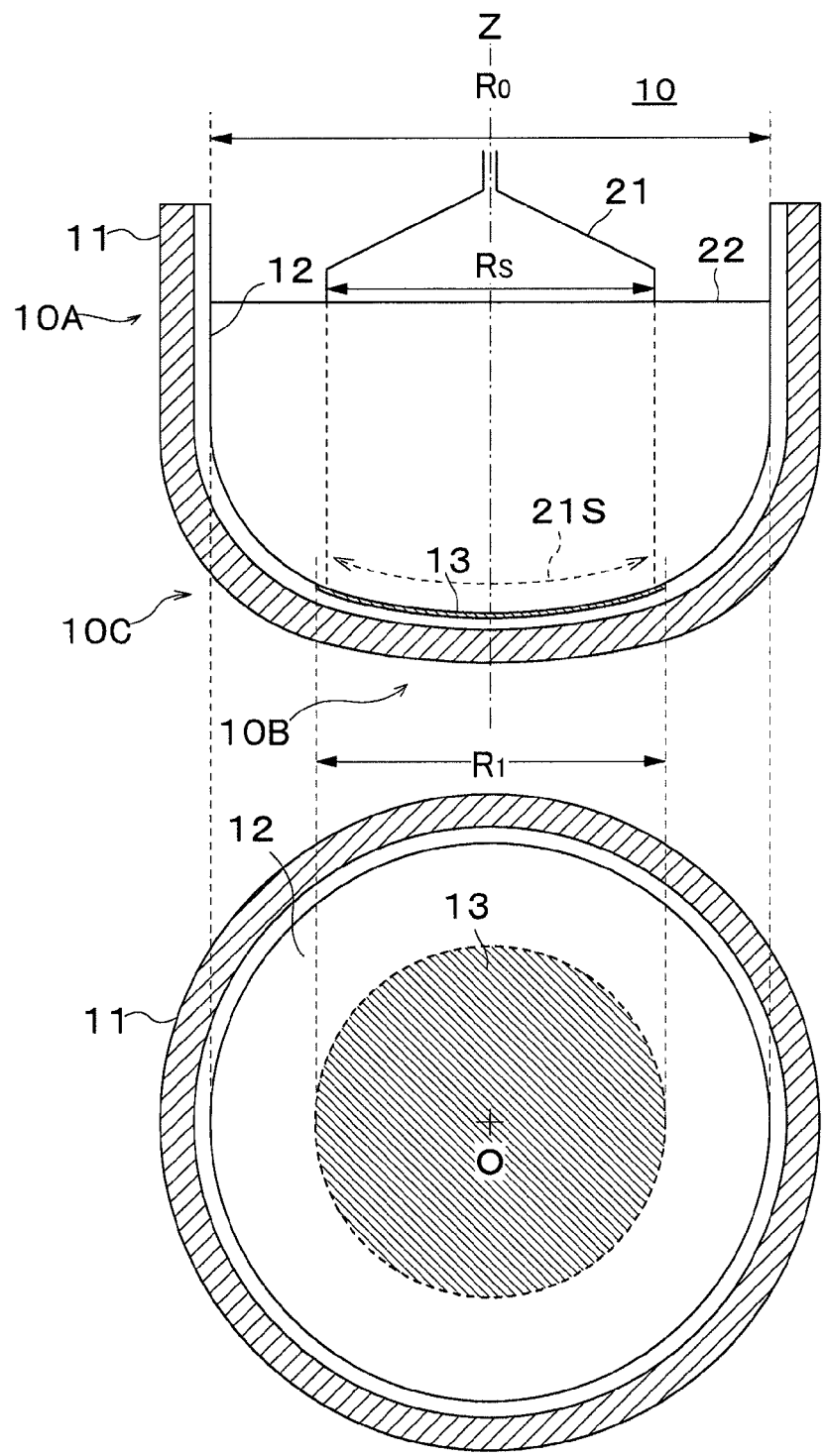
FIG. 2 is a cross sectional and planar view diagram which shows a positional relationship between the silica glass crucible and a silicon single crystal.

FIG. 2 is a cross sectional and planar view diagram which shows a positional relationship between the silica glass crucible and a silicon single crystal.

The shape of the high viscosity region 13 formed on an inner surface of the bottom section of the silica glass crucible 10 seen from the Z axis direction is a round shape with an intersection point with the Z axis at the center, and its diameter $R_1$ is more preferably equal to or more than a diameter $R_S$ of the silicon single crystal 21 which is pulled up. In other words, it is preferred that the high viscosity region 13 covers the projection plane 21S of the silicon single crystal 21. Furthermore, the diameter $R_S$ of the silicon single crystal 21 is a few mm to tens of mm larger than the diameter of the final silicon wafer product.

The diameter $R_S$ of the silicon single crystal 21 is not principally determined by the shape or size of the silica glass crucible 10. However, it is significantly dependent on the diameter $R_0$ of the silica glass crucible 10. If the crucible diameter $R_0$ is too small with respect to the silicon single crystal diameter $R_s$, crystal quality control such as oxygen concentration and oxygen in-plane distribution of the single crystal becomes difficult, and if it is too large, manufacturing costs increase with a necessity of the large size of devices and components. Considering these points, it is preferred that the diameter $R_s$ of the silicon single crystal 21 is $0.3R_0$ or more and $0.5R_0$ or less with respect to the diameter $R_0$ of the silica glass crucible 10, and the diameter R1 is preferred to be $0.5R_0$ with respect to the diameter $R_0$ of the silica glass crucible 10. In other words, it is preferred that the high viscosity region 13 include a region within 50% of the diameter of the crucible from the center of the crucible bottom section. This is because if the diameter $R_1$ of the high viscosity region 13 is smaller than $0.5R_0$, the projection plane 21S of the silicon single crystal 21 can not be covered and the possibility that SiO gas generated from the periphery of the high viscosity region 13 or Ar gas trapped in convex parts will be incorporated into the silicon single crystal 21 is high.

The diameter $R_1$ of the high viscosity region 13 will be explained in detail. For example, in the case of pulling up an approximately 300 mm diameter silicon single crystal using a 32 inch diameter (diameter $R_0$=approximately 800 mm) silica glass crucible, the minimum diameter $R_1$ of the high viscosity region 13 formed on the bottom 10B of the crucible becomes $0.5R_0$=400 mm. If the diameter $R_1$ of the high viscosity region 13 is 400 mm or more, it is possible to effectively reduce the generation of gas bubbles which may be incorporated into the silicon single crystal during the pulling up process.

As explained above, the gas bubbles of the Ar or SiO rise almost perpendicularly, and the gas bubbles which are generated further to the exterior (exterior to the high viscosity region 13) of the projection plane 21S of the silicon single crystal 21 during the process of being pulled up, for some reason, rise while shifting slightly in a horizontal direction, and as a result may be incorporated into the silicon single crystal 21. However, the position of such gas bubbles is in the vicinity of the periphery of the silicon single crystal 21 and because the vicinity of the periphery of the silicon single crystal 21 is later ground as an unnecessary section. It is therefore no problem even if the gas bubbles are incorporated in the silicon single crystal 21.

Figure 3:
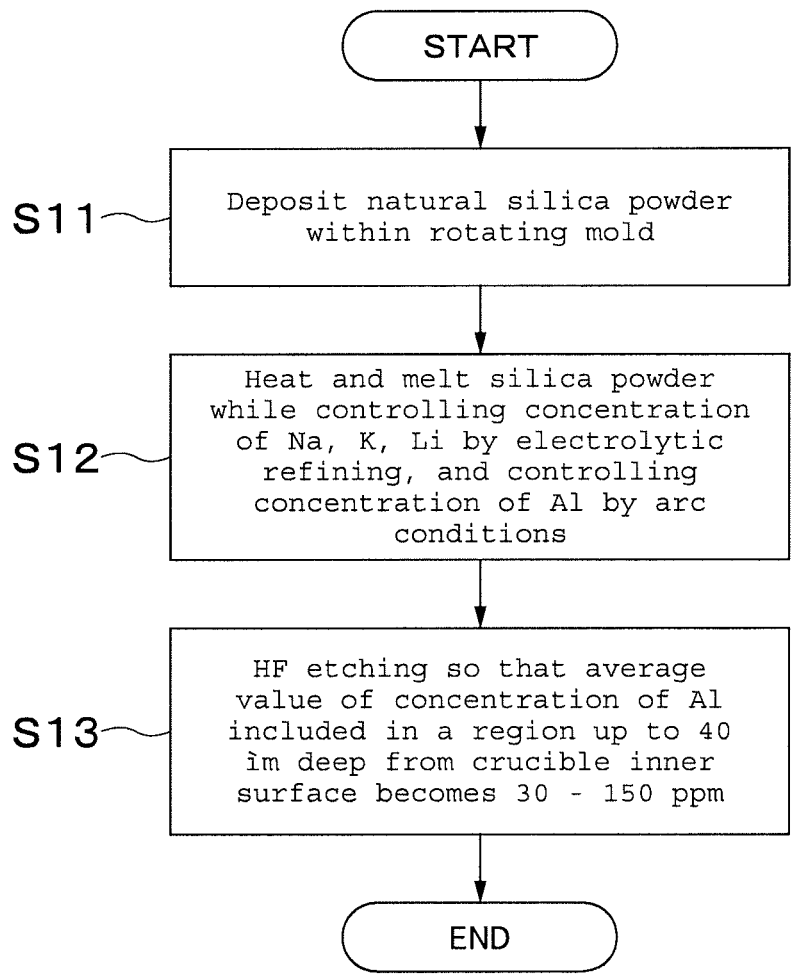
FIG. 3 is a flow chart which shows a manufacturing method of a silica glass crucible.

Next, a manufacturing method of the silica glass crucible 10 will be explained while referring to the flow chart in FIG. 3.

The silica glass crucible 10 can be manufactured by a rotating mold method. In the rotating mold method, natural silica powder is deposited to a certain thickness on an inner surface of a rotating carbon mold (step S11). Then, the entire inner surface of the silica powder is heated to 1720° C. or more from the interior of the mold by a discharge heat due to an arc electrode and the silica powder is arc melted (step S12).

In addition, at the same time as this heating, pressure decreases from the mold side, gas within the melt silica is sucked to the outer layer side via a vent arranged in the mold, and by discharging the gas to the outside via the vent the bubbles in the vicinity of the crucible inner surface are removed and a transparent silica glass layer 12 is formed with essentially no bubbles. Following this, the pressure is weakened or stopped for forcing the bubbles to remain while continuing heating, whereby an opaque layer including a lot of micro bubbles is formed.

Furthermore, electrolytic refining is performed within the arc melting of the silica powder. In electrolytic refining, a voltage is applied to the mold, impurities of the alkali metals etc included in the melt silica glass of the crucible inner layer are moved to the exterior periphery side and the purity of the fused silica glass layer is increased. At this time, a voltage of an arc electrode to ground is maintained within ±500V, a voltage of −1000 to −2000V is applied to a mold which is insulated from ground, and by applying the high voltage to the un-melted silica layer on the exterior periphery, the total concentration of the three elements Na, K and Li included within the natural silica glass layer is controlled to 0.3 ppm or less.

The specific conditions of heating time, heating temperature, and suction pressure are appropriately determined according to the manufacturing conditions such as silica material and crucible diameter. It is possible to control the concentration of Al by the concentration within the raw material powder and the arc conditions. In particular, in the case where the high viscosity region 13 with a high concentration of Al is formed on the crucible bottom section, the heating temperature may be increased or the heating time may be lengthened of a corresponding region. Because partial surface condensation effects are increased by adopting these processes it is possible to increase the viscosity of the crucible bottom section and create a state where it is difficult for damage or dents to form.

Following this, the inner surface of the crucible is etched using hydrofluoric acid (step S13). The amount of etching at this time is appropriately determined so that the concentration of Al or alkali metals impurities within the vicinity of the crucible inner surface becomes appropriate value. By the etching described above, the natural silica glass crucible having a high viscosity region 13 in which an average value of a concentration of Al is 30 ppm or more and 150 or ppm less and a total concentration of the three elements Na, K and Li is 0.3 ppm which are included in a region within 50% of the crucible diameter from the center of the crucible bottom section and up to 40 μm deep from an inner surface is complete.

Furthermore, in the silica glass crucible of the present embodiment, the concentration of impurities in the inner surface of the crucible bottom surface is not adjusted by HF etching, but the concentration of impurities may be adjusted by controlling the deposition speed of the silica powder that is supplied bit by bit to the mold, scattered on the inner surface of the mold and melted for forming the transparent silica glass layer.

As explained above, in the silica glass crucible 10 according to the present embodiment, an inner surface of the crucible is formed by a natural silica glass layer and the concentration of impurities is controlled so that the viscosity of the natural silica glass layer becomes comparatively high and so that there is no decrease in the single crystal yield due to impurities. Accordingly, it is possible to effectively reduce the generation of gas bubbles which can be incorporated into the silicon single crystal during the pulling up process without decreasing the single crystal yield.

The present invention has thus been shown and described with reference to the preferred embodiments. However, it should be noted that the present invention is in no way limited to the details of the described arrangements but changes and modifications may be made without departing from the scope of the appended claims.

For example, in the embodiment described above, an example was given of a structure in which the transparent silica glass layer 12 was formed on the entire crucible from the bottom section of the crucible across to the sidewall section. However, the present invention is not limited to this type of structure. For example, the bubble containing ratio of the crucible inner layer may be intentionally increased with the aim of preventing surface vibration in regions other than "a region within a certain range from the center of the crucible bottom and up to 0.5 mm deep from the inner surface" which becomes the high viscosity region 13. Therefore, in the present invention, gas bubbles do not have to substantially exist in "a region within a certain range from the center of the crucible bottom and up to 0.5 mm deep from the inner surface" and a crucible inner layer other than these regions may be formed as an opaque silica glass layer.

EXAMPLES

Example

A sample A1 of a silica glass crucible having the structure shown in FIG. 1 was prepared. The sample A1 had a diameter of 32 inches (diameter 800 mm), crucible height of 500 mm, and sidewall section thickness of 17 mm, corner section thickness of 25 mm and bottom section thickness of 14 mm from the inner surface to the exterior surface of the crucible. In addition, the diameter of the high viscosity region 13 was 400 mm.

In order to create a crucible with substantially no bubbles in an inner layer, a so called vacuum method was applied. The total concentration of the three elements Na, K and Li was sufficiently reduced by impressing an electric field to the crucible melt. Furthermore, in order to increase the concentration of Al in the crucible bottom section the heating time of the crucible bottom section was extended and in order to adjust the concentration of Al within a region up to 40 μm deep from the inner surface the crucible after melting was etching for 10 minutes using HF (hydrofluoric acid). As a result, the total concentration of the three elements Na, K and Li in the high viscosity region 13 became 0.3 ppm and the concentration of Al became 57 ppm.

Next, after charging 400 kg of polysilicon chunks into the sample A1 of this silica glass crucible, the silica glass crucible was loaded into a single crystal pulling up device, the polysilicon within the crucible was melted in a chamber and a silicon single crystal ingot with a diameter of around 300 mm was pulled up.

Following this, wafers of approximately 1 mm thickness were cut from the silicon single crystal ingot that was pulled up using a wire saw and polished wafers with a mirror polished surface were created using a CMP process. Then, the generation rate of pinholes in the polished wafers was measured. A particle measurement device was used to measure the pinhole generation rate and the number of pinholes in the surface of each polished wafer was measured. The pinhole generation rate is a value in which the total number of pinholes included within multiple wafers obtained from one silicon single crystal divided by the number of wafers. The results are shown in Chart 1.

CHART 1

|  | Impurity concentration of a high viscosity region | | Pinhole generation rate (%) |
| --- | --- | --- | --- |
|  | Na, K, Li (ppm) | Al (ppm) |  |
| Example | 0.3 | 57 | 0.05 |
| Comparative Example | 2 | 24 | 0.1 |

As is shown in Chart 1, in the example in which the total concentration of the three elements Na, K and Li became 0.3 ppm and the concentration of Al became 57 ppm in the region up to 40 μm deep from the inner surface of the high viscosity region, the pinhole generation rate became 0.05% which was a good result being lower than a pinhole generation rate of 0.1%.

Comparative Example

Apart from the total concentration of Na, K and Li being 2 ppm which is relatively high and the concentration of Al being 24 ppm which is relatively low, a crucible sample B1 was prepared having the same structure as example 1. The silicon single crystal was pulled up under the same conditions as example 1 and the pinhole generation rate was measured from the silicon single crystal that was obtained. As a result, the pinhole generation rate increased to 0.1% as is shown in Chart 1.

What is claimed is:

1. A silica glass crucible used for pulling up a silicon single crystal and made from natural silica as a raw material, comprising:

A first region extending a first distance from a center of a bottom section of the crucible and up to 0.5 mm deep from an inner surface and which substantially does not include bubbles; and a second region extending a second distance from the center of the bottom section of the crucible and up to 40 μm deep from the inner surface, wherein:

the second distance is less than the first distance, and an average value of a concentration of Al included in the second region is 30 ppm or more and 150 ppm or less.

2. The silica glass crucible as claimed in claim 1, wherein a total concentration of three elements Na, K and Li included in the second region within the second distance from the center of the bottom section of the crucible and up to 40 μm deep from the inner surface is 0.3 ppm or less.

3. The silica glass crucible as claimed in claim 1, wherein a total concentration of the three elements Na, K and Li included in the second region within the second distance from the center of the bottom section of the crucible is 0.3 ppm or less.

4. The silica glass crucible as claimed in claim 1, wherein a concentration of Al included in the second region within the second distance from the center of the bottom section of the crucible and 100 μm or more deep from the inner surface is 16 ppm or less.

5. The silica glass crucible as claimed in claim 1, wherein the second region within the second distance from the center of the bottom section of the crucible is a region within 50% of a diameter of the crucible from the bottom section.

6. A method for manufacturing a silica glass crucible, comprising:

depositing natural silica powder on an inner surface of a rotating mold;

forming a silica glass crucible by arc melting the natural silica powder; and etching an inner surface of the silica glass crucible so that an average value of a concentration of Al included in a region extending from the center of a bottom section to before a rim of the silica glass crucible, and further extending up to 40 μm deep from an inner surface of the silica glass crucible, becomes 30 ppm or more and 150 ppm or less.

7. The method for manufacturing a silica glass crucible as claimed in claim 6, wherein forming the silica glass crucible further includes electrolytic refining within the arc melting so that a total concentration of three elements Na, K and Li included in the region becomes 0.3 ppm or less after etching.

* * * * *